United States Patent [19]
Nakagawa et al.

[11] Patent Number: 4,864,634
[45] Date of Patent: Sep. 5, 1989

[54] RADIO COMMUNICATION APPARATUS FREE FROM INTERFERENCE BETWEEN LOCAL SIGNAL AND TRANSMISSION SIGNAL

[75] Inventors: Junichi Nakagawa, Tokorozawa; Yoshitomo Kuwamoto, Yokosuka, both of Japan

[73] Assignee: Hitachi, Ltd., Tokyo, Japan

[21] Appl. No.: 268,253

[22] Filed: Nov. 7, 1988

[30] Foreign Application Priority Data

Nov. 11, 1987 [JP] Japan ................. 62-283278

[51] Int. Cl.$^4$ ............................................. H04B 1/40
[52] U.S. Cl. ................................. 455/76; 455/183; 455/255
[58] Field of Search .................... 455/75, 76, 182, 183, 455/164, 165, 118, 208, 209, 255, 264, 259, 314–316, 260; 332/16 R, 19; 331/30, 31

[56] References Cited

U.S. PATENT DOCUMENTS

| | | | |
|---|---|---|---|
| 4,397,038 | 8/1983 | Rzeszewski | 455/183 |
| 4,520,474 | 5/1985 | Vilmur | 455/76 |
| 4,602,225 | 7/1986 | Miller et al. | 455/76 |
| 4,618,997 | 10/1986 | Imazek et al. | 455/183 |
| 4,631,496 | 12/1986 | Borra et al. | 455/76 |
| 4,777,655 | 10/1988 | Numata et al. | 455/76 |

OTHER PUBLICATIONS

Manassewitsch, "Frequency Synthesizers Theory and Design," pp. 355–361, 1976.

Primary Examiner—Robert L. Griffin
Assistant Examiner—Curtis Kuntz
Attorney, Agent, or Firm—Antonelli, Terry & Wands

[57] ABSTRACT

A radio communication apparatus capable of carrying out transmission and reception of signals at a time has a frequency synthesizer and a frequency modulator both in novel structures for removing interference between a local signal and a transmission signal. The frequency synthesizer has a local oscillator controlled by a first phase comparator for phase-comparing a frequency divided output of the local oscillator and a reference frequency signal to provide a local signal. The frequency division of the output of the local oscillator is effectd by a first frequency divider for dividing the frequency of the output of the local oscillator and a variable division ratio frequency divider for dividing the frequency of the output of the first frequency divider. The frequency modulator has a transmission oscillator controlled by a second phase comparator for phase-comparing the output of the first frequency divider and a frequency divided output of the transmission oscillator to provide a transmission signal. The frequency division of the output of the transmission oscillator is effected by a second frequency divider.

10 Claims, 4 Drawing Sheets

RADIO COMMUNICATION APPARATUS FREE FROM INTERFERENCE BETWEEN LOCAL SIGNAL AND TRANSMISSION SIGNAL

BACKGROUND OF THE INVENTION

The present invention relates to a radio communication apparatus capable of transmission and reception at a time.

A general configuration of a radio communication apparatus capable of transmission and reception at a time will be explained with reference to FIG. 1. A local signal having a local oscillation frequency $f_L$ corresponding to a transmission frequency $f_T$ and a reception frequency $f_R$ is generated at a frequency synthesizer 17. The frequency of the local signal can be changed by control data supplied through a bus 101 to the frequency synthesizer from a controller (not shown). The local signal is applied to a frequency modulator 18 and a reception mixer 21. In the frequency modulator 18, a signal modulated by a modulation signal applied thereto from a terminal 16 thereof and the local signal are added to or subtracted from each other at a transmitting mixer, thus generating a transmission signal of a transmission frequency $f_T$. This signal, after amplified by a power amplifier 19, is sent to an antenna (not shown) from a terminal 23 through an antenna duplexer 20. The reception signal of frequency $f_R$ induced in the antenna, on the other hand, is supplied from the terminal 23 to the antenna duplexer 20, and after separated from the transmission signal therein, is supplied to a receiving mixer 21. In the receiving mixer, the reception signal and the local signal are added to or subtracted from each other thereby to generate an intermediate frequency signal of a frequency $f_{IF} = |f_R \pm f_L|$. A demodulator 22 frequency-demodulates the intermediate frequency signal directly or after converting it into a second intermediate frequency signal, and the signal thus demodulated is sent out by way of the terminal 24.

FIG. 2 is a detailed block diagram of the frequency synthesizer 17 and the frequency modulator 18 used in the apparatus of FIG. 1 according to the prior art. The frequency synthesizer 17 includes a reference oscillator 1 for generating a reference signal of a reference frequency, a reference frequency divider 2 for dividing the frequency of the reference signal, a phase comparator 3, a loop filter 4 for smoothing the output of the comparator 3, a local oscillator (voltage-controlled oscillator (hereinafter referred to as "VCO")) 5 responsive to the output of the filter 4, a 2-modulus prescaler 6 for dividing the frequency of the output of the oscillator 5, and a variable ratio frequency divider 7 for dividing the frequency of the output of the prescaler 6. The variable ratio frequency divider 7 is comprised of a programmable counter 8 and a swallow counter 9. The prescaler 6 and the variable ratio frequency divider 7 operate on the principle described in "Frequency Synthesizers Theory and Design" by V. Manassewitch, John Wiley & Sons, pp. 355 to 361, 1976. According to this article, assuming that the two frequency division coefficients or frequency division modulus of the prescaler 6 are, for example, P and P+1, the frequency division coefficient of the program counter 8 is M, and that of the swallow counter 9 is S, the overall frequency division coefficient of a combination of the prescaler 6 and the frequency divider 7 is given by equation (1) below.

$$N = P \cdot M + S \quad (1)$$

The phase comparator 3 compares the phase of the output of the reference frequency divider 2 with that of the output of the variable ratio frequency divider 7. The frequency modulator 18 includes the reference oscillator 1 (shared with the frequency synthesizer 17), a reference frequency divider 27 for dividing the frequency of the reference signal, a phase comparator 11, a loop filter 12 for smoothing the output of the comparator 11, a transmitting oscillator (a transmission VCO) 13 responsive to the output of the filter 12, a transmitting mixer 29 for mixing the output $f_L$ of the local oscillator 5 and the output $f_T$ of the transmission VCO 13, a filter 30 for extracting a signal of the desired frequency (frequency $f_{TIF}$) selectively from the output of the mixer, and a fixed ratio frequency divider 28 for dividing the frequency of the output of the filter 30.

A configuration similar to FIG. 2 is described in a data book of Motorola Inc. entitled "CMOS/NMOS SPECIAL FUNCTIONS DATA", pp. 6-29 to 6-34, especially, FIG. 4 on p. 6-33, 1984.

Such a known conventional apparatus comprises an analog circuit including the transmitting mixer 29 and the filter 30 in the feedback path from the transmission VCO 13 to the phase comparator 11. In the case of a transmission frequency of 200 MHz to 300 MHz or higher, it is difficult to implement this analog circuit in the form of a monolithic IC. It is, therefore, constructed of a hybrid IC using discrete parts. Also, the local signal (frequency $f_L$) disadvantageously leaks out to the terminal 15 as an unwanted signal through the transmitting mixer 29. In a similar manner, the transmission signal (frequency $f_T$) is produced from the terminal 10 as an unwanted signal and disadvantageously leaks out to the receiving mixer 21 (FIG. 1), thereby inconveniently increasing the spurious response of the radio communication apparatus.

SUMMARY OF THE INVENTION

An object of the present invention is to provide a radio communication apparatus capable of transmission and reception at a time free from interference between a local signal and a transmission signal.

Another object of the present invention is to provide a radio communication apparatus capable of transmission and reception at a time free from need of a transmitting mixer and suitable for implementation in the form of an integrated circuit.

Still another object of the present invention is to provide a combination of a frequency synthesizer and a frequency modulator for use in a radio communication apparatus capable of transmission and reception at a time, in which a local signal and a transmission signal are each prevented from becoming an unwanted signal with respect to each other through a transmitting mixer.

According to one aspect of the present invention, a frequency synthesizer and a frequency modulator for use in a radio communication apparatus capable of transmission and reception at a time are respectively configured as described below. In the frequency synthesizer, a local oscillator provides a local signal ($f_L$) under control of a first phase comparator which compares the phase of a frequency-divided output obtained through a combination of a first frequency divider for dividing the frequency of the output of the local oscillator and a variable ratio frequency divider for dividing the frequency of the output of the first frequency divider and the phase of a reference signal of a reference frequency. In the frequency modulator, a transmitting oscillator provides a transmission signal ($f_T$) under control of a second phase comparator for comparing the phase of the output of the first frequency divider in the frequency synthesizer and the phase of a frequency-divided output obtained through a second frequency divider for dividing the frequency of the output of the transmitting oscillator.

According to another aspect of the present invention, in a radio communication apparatus capable of signal transmission and reception at a time and having a frequency synthesizer and a frequency modulator, the frequency modulator has a phase-locked loop including a 2-modulus prescaler for dividing the frequency of the output of a transmission VCO and a phase comparator wherein the 2-modulus prescaler is of the same type as that used for dividing the frequency of the output of a local oscillator employed in the frequency synthesizer, and the frequency divided signal obtained from the 2-modulus prescaler is applied to one of the input terminals of the phase comparator, and the other input of the phase comparator is supplied with an output signal of the 2-modulus prescaler in the frequency synthesizer. The frequency control terminals of both 2-modulus prescalers are commonly supplied with an output signal of a swallow counter of a variable ratio frequency divider employed in the frequency synthesizer. An output of the phase comparator is used to control the frequency of the transmission VCO through a filter.

The frequency of an output of the transmission VCO providing a transmission frequency $f_T$ may be the same as that of the local oscillator in the frequency synthesizer providing a local signal $f_L$.

This configuration eliminates need of the transmitting mixer and the filter in subsequent stage use in the prior art. The frequency divider or 2-modulus prescalers which may be used in place of them are digital circuits suitable for IC construction, thus making it possible to reduce the size of a radio communication apparatus. Further, the lack of a transmitting mixer supplied with both a transmission signal and a local signal prevents each of these signals from becoming an unwanted signal for the other.

A radio communication apparatus according to the present invention may find an application as a mobile radio telephone, a cordless telephone or the like.

DESCRIPTION OF THE PREFERRED EMBODIMENTS

Figure 1:
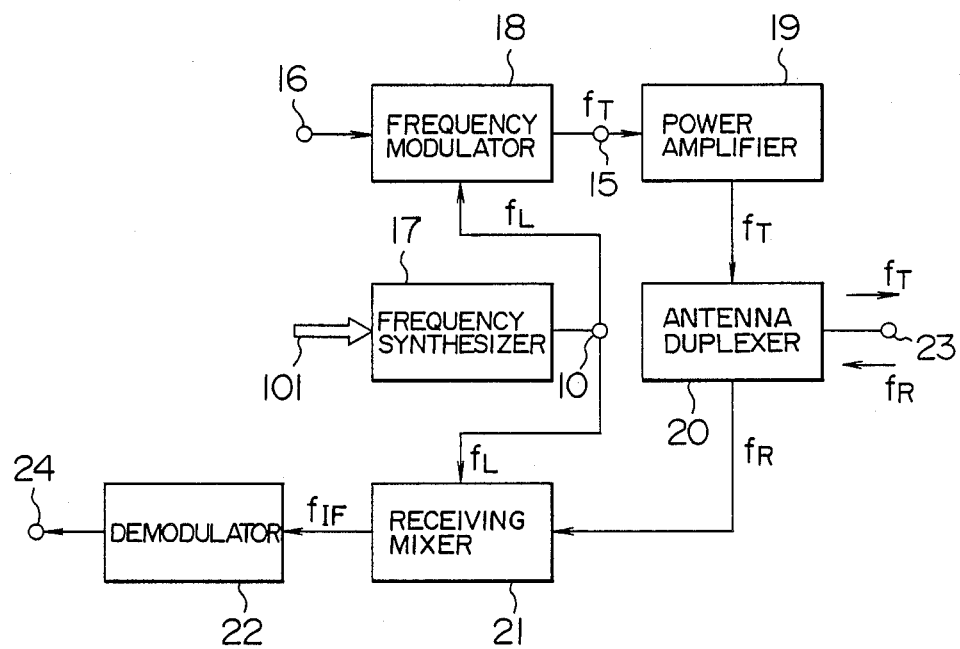
FIG. 1 is a block diagram showing those parts of a radio communication apparatus capable of simultaneous signal transmission and reception which are operative with radio frequency signals.

An embodiment of the present invention will be explained with reference to FIG. 3. A frequency synthesizer 17 which may be used in the apparatus shown in FIG. 1 includes a reference oscillator 1 for generating a reference signal of a reference frequency, a reference frequency divider 2 for dividing the frequency of an output signal of the reference oscillator 1, a phase comparator 3 for phase-comparing an output signal of the reference frequency divider 2 and an output signal of a program counter 8 of a variable ratio frequency divider 7, a loop filter (a low-pass filter) 4 for smoothing an output of the phase comparator 3, a local oscillator 5 (a voltage-controlled oscillator in this case, and hereinafter referred to as the "VCO") with the frequency thereof controlled by an output voltage of the loop filter 4, and a fixed ratio frequency divider 36 (2-modulus prescaler operated with one of two different frequency division moduli in this case) for dividing the frequency of an output signal of the local VCO 5, and the variable ratio frequency divider 7 for further dividing the frequency of a frequency-divided output of the prescaler 36. The variable ratio frequency divider 7 is comprised of a program counter 8 and a swallow counter 9. A frequency-divided output of the program counter 8 is supplied to the phase comparator 3, and an output of the swallow counter 9 (frequency division modulus selection signal) to a frequency division modulus control terminal of the 2-modulus prescaler 36. The frequency of the local VCO 5 is controlled by changing the frequency division coefficient (ratio) of the variable ratio frequency divider 7. This change of the frequency division coefficient (ratio) of the frequency divider 7 may be effected manually, or as an alternative, by applying an output of a controller (not shown) which may be constituted by a 4-bit or 8-bit microprocessor through a bus 101 to the program counter 8 and the swallow counter 9. An output signal of the local VCO 5 is supplied to a receiving mixer 21 (FIG. 1) through a terminal 40. The cooperative frequency-dividing operation of the variable ratio frequency divider 7 and the 2-modulus prescaler in FIG. 3 may be similar to that of the variable ratio frequency divider 7 and the 2-modulus prescaler 6 in FIG. 2.

Figure 2:
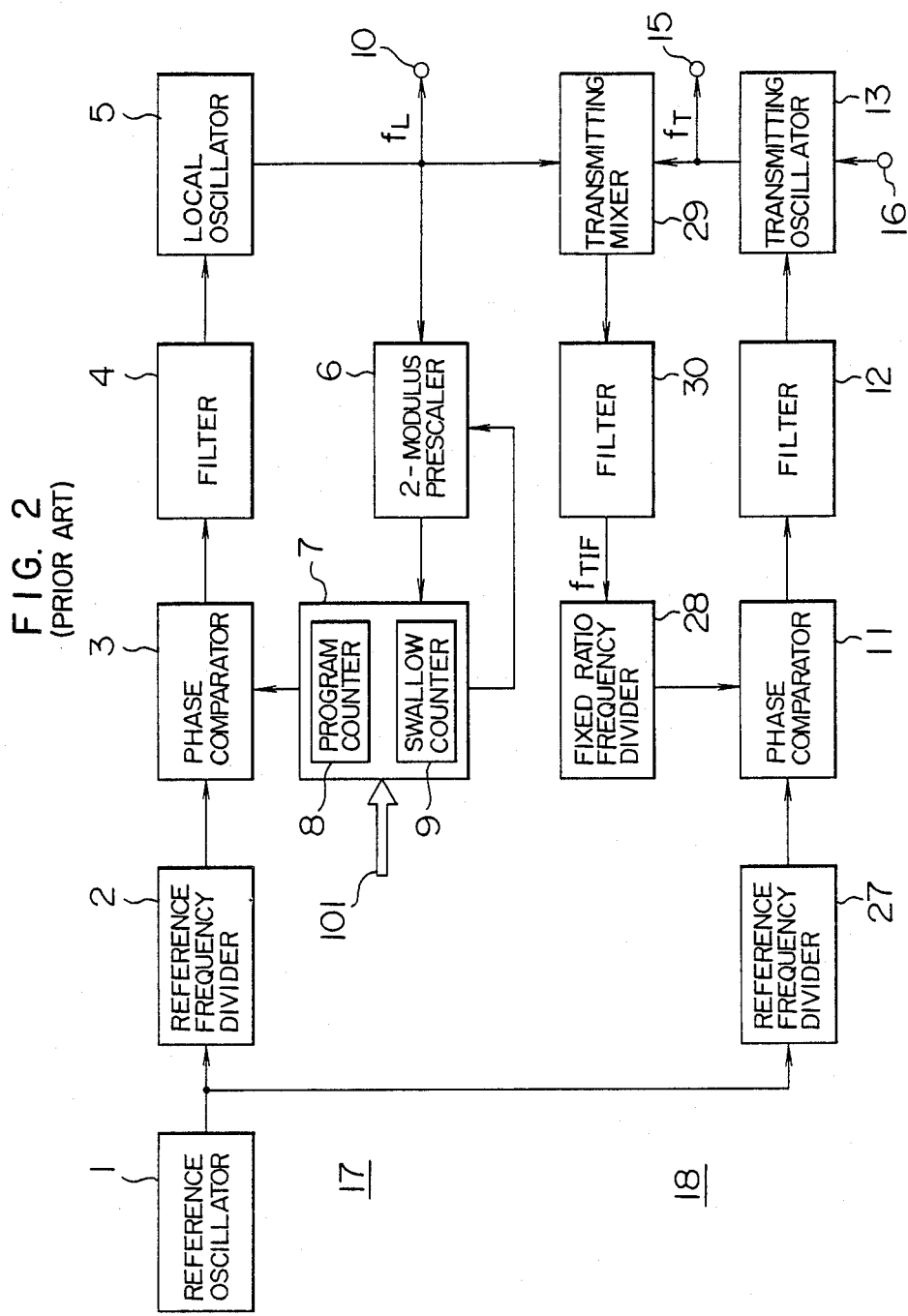
FIG. 2 is a block diagram of a conventional frequency synthesizer and a frequency modulator used in the radio communication apparatus of FIG. 1.

A frequency modulator 18, on the other hand, includes a fixed ratio frequency divider 44 (a 2-modulus prescaler operated with one of two different frequency division moduli in this case) for dividing the frequency of an output signal of the oscillator 13 (a voltage-controlled oscillator in this case), a phase comparator 41 for comparing the phase of an output sgnal of the 2-modulus prescaler 44 and that of the 2-modulus prescaler 36, a loop filter (a low-pass filter) 12 for smoothing the output of the phase comparator 41, and a transmission VCO 13 with the frequency thereof controlled by an output voltage of the loop filter 12. In this embodiment, the frequency division modulus control terminal of the 2-modulus prescaler 44 is supplied with the same frequency division modulus selection signal as the one applied to the frequency division modulus control terminal of the 2-modulus prescaler 36, that is, an output signal of the swallow counter 9. A modulation signal supplied from the terminal 16 is used for frequency modulation of an output signal of the transmission VCO 13 and a signal thus modulated is delivered through a terminal 45 to a power amplifier 19 (FIG. 1).

Now, the operation of the present embodiment will be explained. The frequency synthesizer 17 operates in the manner mentioned below. Assume that the output signal frequency of the reference frequency divider 2 is $f_r$, the frequency division moduli of the 2-modulus prescaler 36 are $P_1$ and $P_1+1$ respectively, the frequency division coefficient (ratio) of the program counter 8 is M, and the frequency division coefficient (ratio) of the swallow counter 9 is S. Using equation (1), the frequency $f_L$ of the local VCO 5 is given by equation (2) below.

$$f_L=(P_1 \cdot M+S) \cdot f_r \qquad (2)$$

Further, assuming that the frequency division moduli of the 2-modulus prescaler 44 are $P_2$ and $P_2+1$, respectively, and in this embodiment, $P_1$ is set to a value equal to $P_2$. If the amplitude of the modulation signal applied to the terminal 16 is zero, the output signal frequency of the transmission VCO 13 will be a center frequency $f_T$ not frequency-modulated. With this assumption, the frequency-divided output frequency of the 2-modulus prescaler 44 takes a value of $f_T/P_1$ or $f_T/(P_1+1)$ in accordance with the frequency division modulus selected by the frequency division modulus selection signal supplied from the swallow counter 9. The two perscalers are controlled in frequency division coefficient (ratio) by the same frequency division modulus selection signal, and thus the same frequency modulus is selected, so that the same signal frequency is applied to the phase comparator 41. Thus $f_T=f_L$. If the amplitude of the modulation signal is not zero, on the other hand, the output signal of the transmission VCO 15 is frequency-modulated. Since this modulation component is removed by the loop filter, however, the average frequency of the transmission VCO becomes equal to $f_L$. As a result, the transmission frequency $f_T$ is given by equation (3) below derived from equation (2).

$$f_T=(P_1 \cdot M+S) \cdot f_r \qquad (3)$$

In view of the fact that the transmission frequency $f_T$ is specified by a system for the radio communication apparatus involved, the frequency division coefficients (ratios) $P_1$, M and S and the frequency $f_L$ are set in a manner to satisfy equation (3). In this case, the output frequency $f_{IF}$ of the receiving mixer 21 in FIG. 1 is given as shown in equation (4) below.

$$f_{IF}=|f_L-f_R|=|f_T-f_R| \qquad (4)$$

The embodiment under consideration may be configured with four monlithic ICs except for the VCOs 5, 13, loop filters 4, 12 and the resonator of the reference oscillator 1. For example, MC145156-1 manufactured by Motorola may be used to constitute circuits corresponding to the reference oscillator 1, the reference frequency divider 2, the phase comparator 3, the program counter 8 and the swallow counter 9; μPB566C manufactured by Nippon Electric Company may be used to constitute the 2-modulus prescalers 36, 44; and MC12040 manufactured by Motorola may be used to constitute the phase comparator 41. These ICs available on the market includes CMOS or ECL circuits. If the BiCMOS technique capable of realizing bipolar transistors and CMOS transistors on a single chip is used, the above-mentioned four ICs may be formed on one chip. In short, according to the present embodiment, the local signal $f_L$ and the transmission signal $f_T$ are prevented from being mixed with an unwanted signal on the one hand, and a very compact radio communication apparatus is realized on the other hand.

Although the aforementioned embodiment refers to a case in which $P_1=P_2$ for rendering $f_T$ equal to $f_L$, it is obvious that $f_T$ may be rendered equal to $kf_L$ (k: a positive number) along with a relationship $P_1=P_2/k$ with the same effect.

Figure 3:
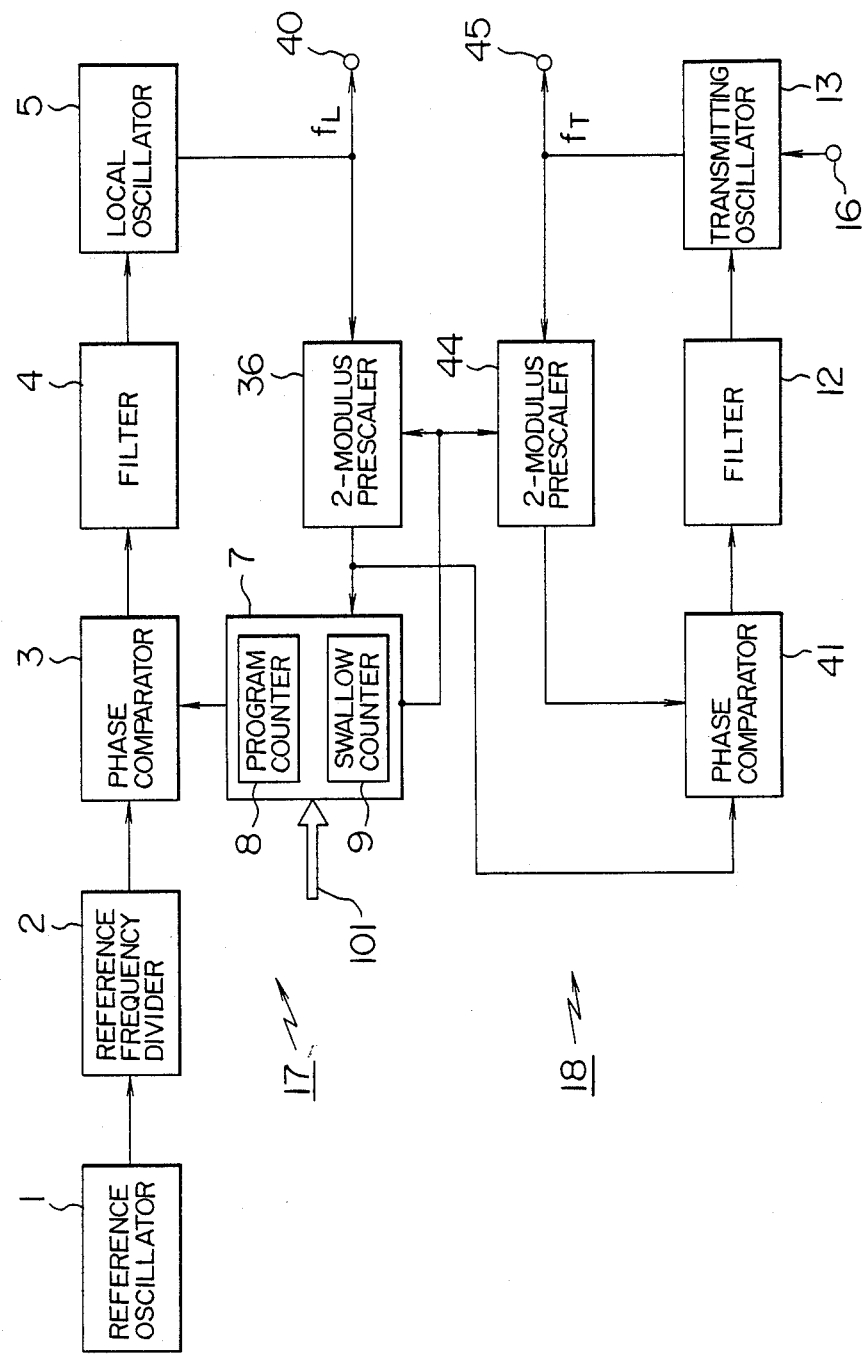
FIGS. 3 and 4 are block diagrams showing embodiments of the present invention.
Figure 4:
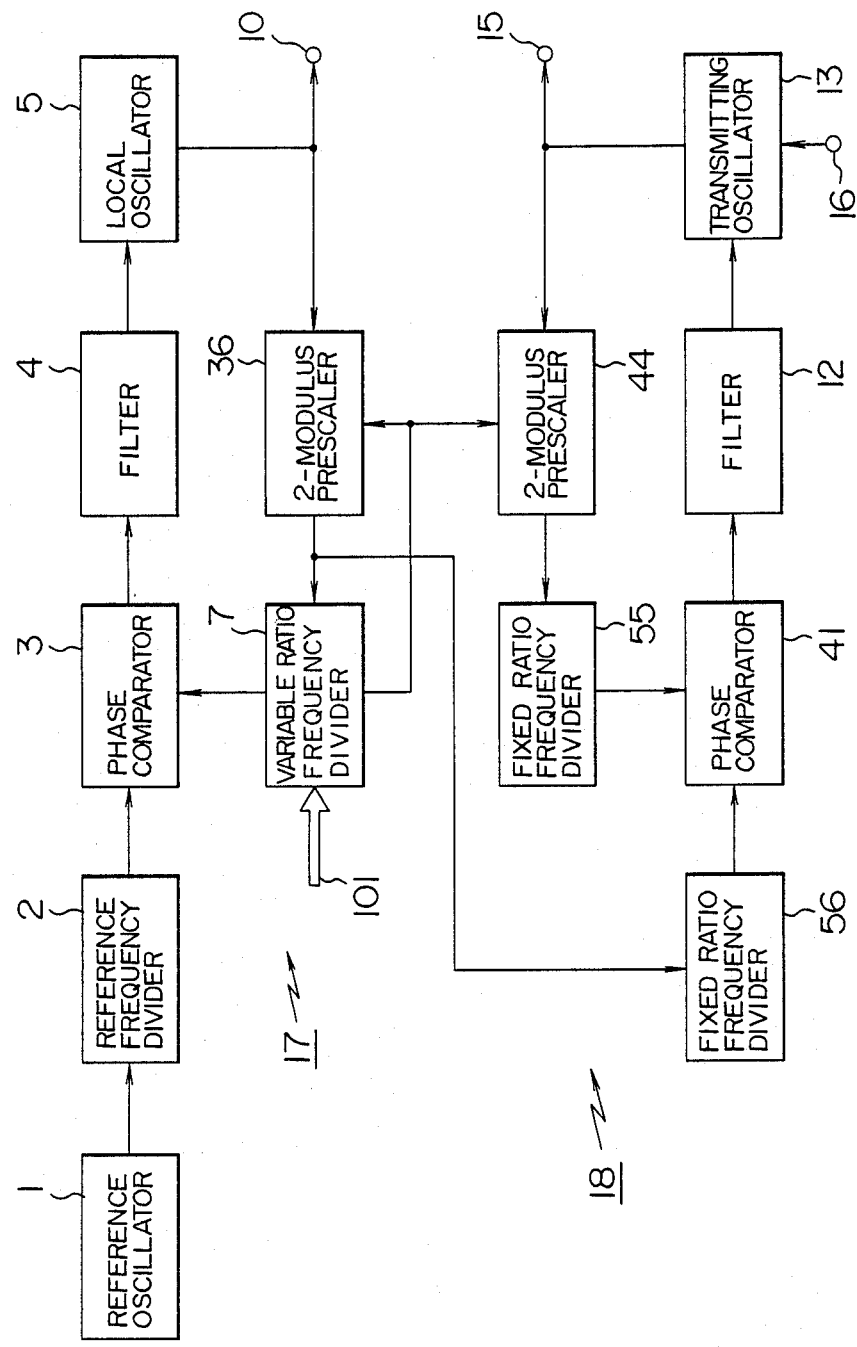

Another embodiment is shown in FIG. 4. In this embodiment, fixed ratio frequency dividers 55 and 56 are inserted between the 2-modulus prescaler 44 and the phase comparator 41 and between the 2-modulus prescaler 36 and the phase comparator 41, respectively in the embodiment of FIG. 3. The two fixed ratio frequency dividers have same frequency division coefficient L. As a result, two signals supplied to the phase comparator 41 have a frequency equal to 1/L that of the outputs of the prescalers 36 and 44 but the embodiment under consideration operates in the same manner as the embodiment of FIG. 1 with the transmission frequency $f_T$ given by equation (3). This embodiment produces the same effect as the embodiment of FIG. 3. Further, in the embodiment shown in FIG. 4, due to the provision of the fixed ratio frequency dividers 55 and 56 as described above, the frequencies of the signals to be dealt with by the phase comparator 41 are lowered thereby, with a result that the linearity of the input-output characteristics of the phase comparator is improved to facilitate the design of the phase-locked loop in the frequency modulator 18.

In the embodiments of FIGS. 3 and 4, it is obvious that the objects of the present invention are attainable even if the two different frequency division moduli of the 2-modulus prescalers 36 and 44 are generalized as $P_1$, $P_1'$ and $P_2$, $P_2'$ respectively.

It is also apparent that the objects of the present invention may be achieved by the embodiments shown in FIGS. 3 and 4 if the 2-modulus prescalers 36 and 44 are replaced by fixed prescalers (fixed ratio frequency dividers) each having a fixed ratio frequency division coefficient (ratio) P respectively, and the variable ratio frequency divider 7 including the program counter 8 and the swallow counter 9 by a single program (programmable) counter (variable ratio frequency divider).

Furthermore, in the embodiment of FIG. 4, the objects of the present invention may also be achieved evidently if the fixed ratio frequency dividers 55, 56 are replaced by variable ratio frequency dividers respectively which are controlled so as to have the same frequency division coefficient (ratio).

We claim:

1. A combination of a frequency synthesizer and a frequency modulator for use in a radio communication apparatus capable of carrying out transmission and reception of signals at a time, in which:

the frequency synthesizer includes
 a. a frequency generator for providing a reference signal having a reference frequency,
 b. a first phase comparator having an input terminal for receiving said reference signal and another input terminal,
 c. a first oscillator responsive to the output of said first comparator, and
 d. a first feedback path having a first frequency divider for dividing the frequency of the output of said first oscillator and a variable division ratio frequency divider for dividing the frequency of the output of said first frequency divider, the output of said variable division ratio frequency divider being fed to said another input terminal of said first phase comparator for phase comparison between said reference signal and said output of said variable division ratio frequency divider, the output of said first oscillator being used as a local signal for the signal reception;

the frequency modulator includes
 e. a second phase comparator having input terminals, f. a second oscillator responsive to the output of said second comparator, said second oscillator having an input terminal for receiving a modulation signal with which the output of said second oscillator is to be modulated, and g. a second feedback path having a second frequency divider for dividing the frequency of the output of said second oscillator, the output of said second frequency divider being fed to one of the input terminals of said second phase comparator; and said first frequency divider is connected with said second phase comparator such that a portion of said output of said first frequency divider is fed to another input terminal of said second phase comparator for phase comparison between the outputs of said first and second frequency dividers.

2. The combination according to claim 1, in which said first and second frequency dividers have coefficients for frequency division such that the frequencies of the outputs of said first and second frequency dividers are identical with each other.

3. The combination according to claim 2, in which said first and second frequency dividers have coefficients for frequency division identical with each other so that the frequencies of said first and second oscillators are identical with each other.

4. The combination according to claim 1, in which both of said first and second oscillators are voltage-controlled oscillators.

5. The combination according to claim 1, in which said first phase comparator, said first oscillator and said first feedback path constitute a first phase-locked loop, and said second phase comparator, said second oscillator and said second feedback path constitute a second phase-locked loop.

6. A radio communication apparatus capable of carrying out transmission and reception of signals at a time comprising a frequency synthesizer and a frequency modulator in which:

the frequency synthesizer includes
  a. a frequency generator for providing a reference signal having a reference frequency,
  b. a first phase comparator having an input terminal for receiving said reference signal and another input terminal,
  c. a first oscillator responsive to the output of said first comparator, and
  d. a first feedback path having a first 2-modulus prescaler for dividing, by one of two different frequency division moduli, the frequency of the output of said first oscillator and a variable ratio frequency divider for dividing the frequency of the output of said first 2-modulus prescaler and generating a frequency division modulus selection signal, the frequency division output of said variable ratio frequency divider being fed to said another input terminal of said first phase comparator for phase comparison between said reference signal and said output of said variable ratio frequency divider, said frequency division modulus selection signal generated by said variable ratio frequency divider being supplied to said first 2-modulus prescaler to determine the frequency division modulus with which said first 2-modulus prescaler is operative, the output of said first oscillator being used as a local oscillation signal for the signal reception;

the frequency modulator includes
  e. a second phase comparator having input terminals,
  f. a second oscillator responsive to the output of said second comparator, said second oscillator having an input terminal for receiving a modulation signal with which the output of said second oscillator is to be modulated, and
  g. a second feedback path having a second 2-modulus prescaler for dividing, by one of two different frequency division moduli, the frequency of the output of said second oscillator, said frequency division modulus selection signal generated by said variable ratio frequency divider being also supplied to said second 2-modulus prescaler, the output of said second 2-modulus prescaler being fed to one of the input terminals of said second phase comparator; and said first 2-modulus prescaler is connected with said second phase comparator such that a portion of said output of said first 2-modulus prescaler is fed to another input terminal of said second phase comparator for phase comparison between the outputs of said first and second 2-modulus prescalers.

7. A radio communication apparatus according to claim 6, in which the two different frequency division moduli of said first 2-modulus prescaler are the same as those of said second 2-modulus prescaler so that said first and second 2-modulus prescalers are always operable with an identical frequency division modulus.

8. A radio communication apparatus according to claim 6, further comprising a first fixed ratio frequency divider for dividing the frequency of the output of said first 2-modulus prescaler so that said portion of said output of said first 2-modulus prescaler is fed, after frequency division by said first fixed ratio frequency divider, to said another input terminal of said second phase comparator and a second fixed ratio frequency divider for dividing the frequency of the output of said second 2-modulus prescaler so that the output of said second 2-modulus prescaler is fed, after frequency division by said second fixed ratio frequency divider, to said one input terminal of said second phase comparator for the phase comparison between the outputs of said first and second 2-modulus prescalers.

9. A radio communication apparatus according to claim 6, in which each of said first and second 2-modulus prescalers have two different frequency division moduli such that the frequencies of the outputs of said first and second 2-modulus prescalers are identical with each other.

10. A radio communication apparatus according to claim 9, in which said first 2-modulus prescaler has two different frequency division moduli identical with those of said second 2-modulus prescaler so that the frequencies of said first and second oscillators are identical with each other.

* * * * *